(12) United States Patent
Martiel et al.

(10) Patent No.: US 11,062,079 B2
(45) Date of Patent: Jul. 13, 2021

(54) METHOD FOR COMPILING A QUANTUM CIRCUIT ON A QUANTUM PROCESSOR WITH TRAPPED IONS

(71) Applicant: BULL SAS, Les Clayes-sous-Bois (FR)

(72) Inventors: Simon Martiel, Bezons (FR); Timothee Goubault De Brugiere, Bezons (FR)

(73) Assignee: BULL SAS, Les Clayes sous Bois (FR)

( * ) Notice: Subject to any disclaimer, the term of this patent is extended or adjusted under 35 U.S.C. 154(b) by 0 days.

(21) Appl. No.: 16/727,029

(22) Filed: Dec. 26, 2019

(65) Prior Publication Data
US 2020/0218848 A1    Jul. 9, 2020

(30) Foreign Application Priority Data
Dec. 26, 2018 (FR) ...................... 1874175

(51) Int. Cl.
*G06F 30/398* (2020.01)
*G06F 30/392* (2020.01)
*G06N 10/00* (2019.01)

(52) U.S. Cl.
CPC .......... *G06F 30/398* (2020.01); *G06F 30/392* (2020.01); *G06N 10/00* (2019.01)

(58) Field of Classification Search
CPC ...... G06F 30/398; G06F 30/392; G06N 10/00
See application file for complete search history.

(56) References Cited

U.S. PATENT DOCUMENTS

| | | | |
|---|---|---|---|
| 2019/0121921 A1* | 4/2019 | Nam | ...................... G06N 10/00 |
| 2019/0205783 A1* | 7/2019 | Nam | ................... G06F 15/8007 |
| 2020/0184024 A1* | 6/2020 | Nam | ..................... G06F 30/327 |

OTHER PUBLICATIONS

Correspondence from the French National Institute of Industrial Property Office (INPI—Institute National De La Propriété Industrielle) for FR1874175 dated Nov. 14, 2019; Preliminary Research Report of the French National Institute of Industrial Property Office for FR1874175 dated Nov. 5, 2019; and Written Opinion on the Patentability of the Invention issued by the French National Institute of Industrial Property Office for FR1874175.

(Continued)

*Primary Examiner* — Vuthe Siek
(74) *Attorney, Agent, or Firm* — Meagher Emanuel Laks Goldberg & Liao, LLP

(57) ABSTRACT

A method for compiling a quantum circuit on a trapped-ion quantum processor includes: obtaining a quantum circuit containing only a first predetermined category of two-qubit quantum gates, and/or one-qubit quantum gates; a step of compiling the quantum gates so that they only contain collective or entangling N-qubit quantum gates of a third predetermined category, one-qubit quantum gates of a fourth predetermined category, and so that all or at least some of those collective or entangling quantum gates simultaneously apply to at least three qubits, advantageously simultaneously apply to the majority of qubits, and even more advantageously simultaneously apply to all the qubits; and a step of grouping together the compiled quantum gates in a compiled quantum circuit.

19 Claims, 6 Drawing Sheets

(56) References Cited

OTHER PUBLICATIONS

Martinez, E.A., Monz, T., Nigg, D., Schindler, P., Blatt, R., 'Compiling quantum algorithms for architectures with multi-qubit gates', 2016, New Journal of Physics, Institute of Physics Publishing, vol. 18, No. 6, 63029, pp. 1-13, DOI: 10.1088/1367-2630/18/6/063029.
Maslov, D., Nam, Y., 'Use of global interactions in efficient quantum circuit constructions', 2017, Cornell University Library, pp. 1-17, DOI: 10.1088/136/2630/AAA398.
Maslov, D., 'Basic circuit compilation techniques for an ion-trap quantum machine', 2017, New Journal of Physics, vol. 19, No. 2, pp. 1-18, DOI: 10.1088-1367-2630/aa5e47.

* cited by examiner

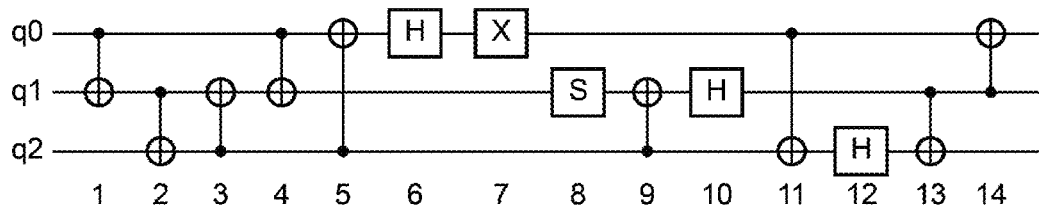
FIG. 2a
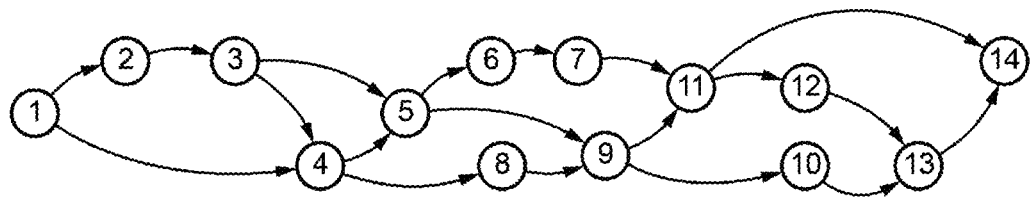
FIG. 2b
Data: a set $C$ of entangling gates
Result: a subcircuit *Layer* of local gates and a set *Ent* of entangling gates
*Layer* ← [];
*Ent* ← ∅;
foreach *qubit q appearing in C* do
    *gate* ← first gate appearing on wire $q$ after $C$;
    while *gate is a local gate* do
        *Layer.append(gate)*;
        *gate* ← *get_succ(gate.q)*;
    end
    *Ent* ← *Ent* ∪ *{gate}*;
end
FIG. 3a

Data: an initial set $C$ of entangling gates
Result: a subcircuit *Layer* of entangling gates
*Layer* ← [];
$D$ ← $C$;
while $D$ is not empty do
    $M$ ← $min(D)$;
    $D$ ← $D - M$;
    foreach gate $g$ in $M$ do
        can_add ← True
        foreach qubit $q$ appearing in $g$ do
            if $q$ appears in *Layer* and $get\_pred(g,q) \notin$ *Layer* then
                can_add ← False;
            end
        end
        if can_add then
            *Layer*.append($g$);
            $D$ ← $D \cup successors\_ent(g)$;
        end
    end
end

FIG. 3b

```
Data: the table H of dimensions NxN
Result: a sequence of operations O fan-out CNOTs
O ← [ ];
foreach i = 0 to N-1 do
    pivot = 0
    foreach j = i +1 to N-1 do
        if H[j][i] == 1 then
            pivot = j
            break
        end
    end
    targets = [ ]
    foreach j = 0 to N-1 do
        if j != pivot then
            if H[j][i] == 0 and j == i then
                H[j] = H[pivot] XOR H[j]
                targets.append(j)
            end
            if H[j][i] == 1 and j != i then
                H[j] = H[pivot] XOR H[j]
                targets.append(j)
            end
        end
    end
    O.append([pivot, targets])
    if pivot != i then
        H[pivot] = H[pivot] XOR H[i]
        O.append([i, [pivot]])
    end
end
```

FIG. 4

METHOD FOR COMPILING A QUANTUM CIRCUIT ON A QUANTUM PROCESSOR WITH TRAPPED IONS

CROSS-REFERENCE TO RELATED APPLICATIONS

This application claims the benefit of French Patent Application No. 1874175 filed Dec. 26, 2018, the disclosure of which is herein incorporated by reference in its entirety.

TECHNICAL FIELD

The invention falls within the field of methods for compiling a quantum circuit on a trapped-ion quantum processor.

PRIOR ART

From a first prior art *Compiling quantum algorithms for architectures with multi-qubit gates*, Martinez et al., a method is known for compiling a quantum circuit on a quantum processor to make it possible to obtain a compiled quantum circuit comprising a minimum number of entangling quantum gates.

The method proposes reading all the gates of a quantum circuit and building unitary operations, meaning a unitary matrix of size 2N×2N, where N is the number of qubits in the quantum circuit. Using an optimizer, entangling gates that can be compiled on a trapped-ion quantum processor are added. At the same time, local phase-shift gates configured at different angles are added to cause the unitary matrix to converge. If the unitary matrix does not converge, a new entangling gate is added to the quantum circuit.

Although this method is optimal in terms of results, as the circuit obtained comprises the fewest entangling quantum gates, it is exponential in terms of time and memory, as a unitary matrix of size 2N×2N must be calculated with each incrementation. This method therefore cannot be applied for quantum circuits of more than four qubits.

Another known method is described in the document *Basic circuit compilation techniques for an ion-trap quantum machine*, Maslov and *Use of global interactions in efficient quantum circuit constructions*, Maslov and Nam.

This method proposes programming certain blocks of the quantum circuit in a language readable by a trapped-ion quantum processor. Certain blocks of the quantum circuit are rewritten using entangling quantum gates that can be compiled on a trapped-ion processor.

However, this method is not automatic, because programming is done by a programmer. Thus, the risk is that the programmer does not detect some blocks of the quantum circuit that need rewriting. This method is therefore not optimal.

TECHNICAL PROBLEM

These known solutions do not make it possible to compile a quantum circuit automatically, while enabling a fast, effective compiling of the entire quantum circuit.

The invention at least partially remedies the shortcomings of the prior art and optimizes the compiling of quantum circuits on trapped-ion quantum processors.

Therefore, according to the invention, it will be beneficial to transform the quantum circuit so that only quantum gates that can be executed by the quantum processor remain, and to automatically share some of those quantum gates among multiple qubits, and preferentially among a majority or even all of the qubits. This sharing makes it possible both for the compilation to be very efficient and to limit the number of complex quantum gates in that quantum circuit, thereby making it easier to scale up when the number of qubits in the circuit is increased, because it is thus sufficient to also share those quantum gates on the additional qubits.

The compilation method according to the invention therefore enables the compiling of a quantum circuit in a way that is completely automated and optimized in terms of efficiency.

There is proposed a method for compiling a quantum circuit on a trapped-ion quantum processor, comprising:
potentially a prior step of transforming the quantum circuit so that it no longer contains anything except:
a first predetermined category of two-qubit quantum gates,
and/or one-qubit quantum gates,
a step of compiling the quantum gates,
so that they only contain:
collective or entangling N-qubit quantum gates of a second predetermined category,
one-qubit quantum gates of a third predetermined category,
and so that all or at least some of those collective or entangling quantum gates simultaneously apply to at least three qubits, advantageously simultaneously apply to the majority of qubits, and even more advantageously simultaneously apply to all the qubits.
a step of grouping together the compiled quantum gates in a compiled quantum circuit.

According to another aspect, there is proposed a Method for compiling a quantum circuit on a trapped-ion quantum processor, comprising:
a step of breaking down all or some of the quantum circuit into one or more phase polynomials,
a step of directly recomposing said all or some of the quantum circuit into the form of entangling Molmer-Sorensen quantum gates without going through the form of CNOT quantum gates,
a step of grouping together the recomposed quantum gates to obtain a compiled circuit.

Furthermore, the breakdown of all or some of the quantum circuit into phase polynomials makes it possible to rewrite those parts of the quantum circuit directly in the form of entangling Molmer-Sorensen quantum gates. In other words, it is not necessary to recompose those parts of the quantum circuit in the form of other CNOT gates. The method therefore makes it possible to limit the number of steps during recomposition, thereby increasing both the efficiency of its implementation and its compilation speed.

The features described in the following paragraphs may optionally be implemented. They may be implemented independently from one another, or in combination with one another:

Preferably, the method also comprises, between the possible prior step of transformation and the step of compiling the quantum gates:
a step of separating said quantum circuit into:
local layers comprising only one-qubit quantum gates,
entangling layers comprising only:
two-qubit quantum gates of the first category,
and/or one-qubit quantum gates of a fourth predetermined category, said step of compiling the quantum gates further comprising:

a step of compiling the local layers, a step of compiling the entangling layers, separate from the step of compiling the local layers, the step of compiling the entangling layers transforming the quantum gates of those entangling layers so that they contain only:

collective or entangling N-qubit quantum gates of the second predetermined category, one-qubit quantum gates of the third predetermined category, said step of grouping together the compiled quantum gates into a compiled quantum circuit is a grouping step that comprises grouping together the compiled local layers and the compiled entangling layers in a compiled quantum circuit.

Thus, according to the invention, it will be beneficial to break down the quantum circuit into layers of different types. The layers of the quantum circuit are broken down in such a way as to comprise only quantum gates of a certain predetermined type. This breakdown makes it possible to compile those layers using compilation processing specific to the quantum gates contained in those layers. The application of specific quantum processing makes it possible to greatly increase the effectiveness of the compilation method. Additionally, the breakdown makes it possible to group together multiple quantum gates in the same layer in order to apply a single compilation processing for a plurality of gates, thereby making it possible to substantially increase the speed of compiling the quantum circuit as a whole.

The compilation method according to the invention therefore enables the compiling of a quantum circuit in a way that is completely automated and optimized, both in terms of efficiency and in terms of compilation speed.

Preferably, the step of compiling the entangling layers comprises:

a breakdown of each entangling layer into a phase polynomial, a direct recomposition in the form of quantum gates of the second category and the third category of quantum gates without going through a form of quantum gates of the first category of quantum gates.

Thus, the breakdown of all or some of the quantum circuit into phase polynomials makes it possible to rewrite those parts of the quantum circuit directly in the form of entangling Molmer-Sorensen quantum gates. In other words, it is not necessary to recompose those parts of the quantum circuit in the form of other CNOT gates. The method therefore makes it possible to limit the number of steps during recomposition, thereby increasing both the efficiency of its implementation and its compilation speed.

Preferably, the step of compiling the local layers comprises:

a breakdown of each local matrix of a local layer into a sequence of quantum gates with a rotation along the Z-axis, a rotation along the X-axis, and a rotation along the Z-axis, a sub-breakdown of the rotation along the X-axis into a sequence of Hadamard quantum gates, with a Hadamard rotation along the Z-axis, a sub-sub-breakdown of the Hadamard gate into a sequence of quantum gates with a rotation along the Z-axis, a rotation along the X-axis, and a rotation along the Z-axis, all three rotations having an angle of pi or pi/2.

a sharing between qubits, of rotation gates along the X-axis with an angle of pi/2.

This breakdown of the local layers makes it possible to obtain quantum gates with a rotation along the X-axis having a fixed angle. The gates rotating along the X-axis therefore no longer depend on local matrices, which makes it possible to share the quantum gates rotating along the X-axis with a majority of qubits from the local layers, and preferentially with all the qubits from the local layers. Furthermore, such a breakdown makes it possible to obtain a recomposed quantum circuit from the local layers that contains only two collective gates rotating along the X-axis, which greatly improves the accuracy of the method.

Preferably, the method comprises:

a prior step of transforming the quantum circuit so that it no longer contains anything except:

a first predetermined category of two-qubit quantum gates, and/or one-qubit quantum gates.

Thus, this prior step makes it possible to transform the circuit so that it no longer contains anything except quantum gates on which the steps of the method according to the invention can be implemented.

Preferably, during the step of compiling the entangling layers:

the number of collective or entangling quantum gates of the second category of quantum gates in the compiled entangling layers is minimized as a priority relative to the minimization of the quantum gates of the third category.

As the collective and entangling gates of the second category are the most costly in terms of execution time and accuracy of the method, minimizing their number as a priority makes it possible to obtain a quantum circuit that is less costly in terms of execution time, and more accurate when compiled.

Preferably, the first predetermined category of two-qubit quantum gates comprises:

diagonal two-qubit quantum gates,

CNOT quantum gates, the second predetermined category of two-qubit quantum gates comprises:

Molmer-Sorensen N-qubit entangling gates, collective gates rotating along the X-axis, the third predetermined category of one-qubit quantum gates comprises:

local phase shifts along the Z-axis.

Preferably, the fourth predetermined category of one-qubit quantum gates comprises:

diagonal one-qubit gates.

The quantum gates of the four predetermined categories therefore correspond to the quantum gates that can be executed on a trapped-ion quantum processor.

BRIEF DESCRIPTION OF THE DRAWINGS

Other features, details, and advantages of the invention will become apparent upon reading the detailed description below and analyzing the attached figures, in which:

FIG. 2a shows a representation of a quantum circuit comprising two-qubit quantum gates of the first predetermined category and one-qubit quantum gates, before the separation of the quantum circuit into local and entangling layers.

FIG. 2b shows a directed acyclic graph of the quantum circuit of FIG. 2b, used in one particular embodiment of the invention to separate the quantum circuit into local and entangling layers.

FIG. 3a shows a pseudo-code for the extraction of the local layers according to one embodiment of the invention.

FIG. 3b shows a pseudo-code for the extraction of the entangling layers according to one embodiment of the invention.

FIG. 4 shows a pseudo-code of a Gaussian elimination used for the recomposition of the entangling layers according to one embodiment of the invention.

DESCRIPTION OF THE EMBODIMENTS

Figure 1:
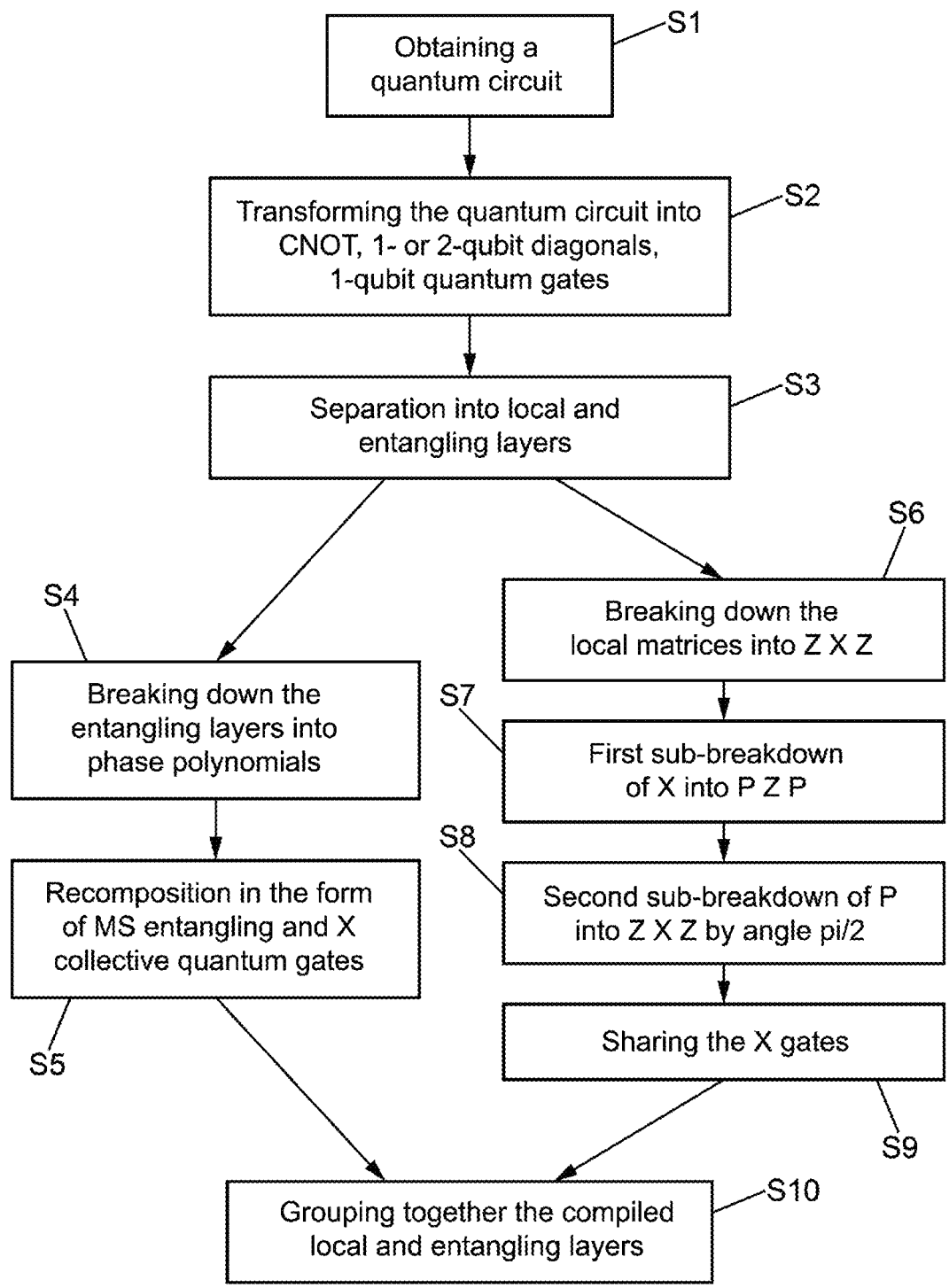
FIG. 1 shows a flowchart of the main steps of a method for compiling a quantum circuit on a trapped-ion quantum processor according to one embodiment of the invention.
Figure 5:
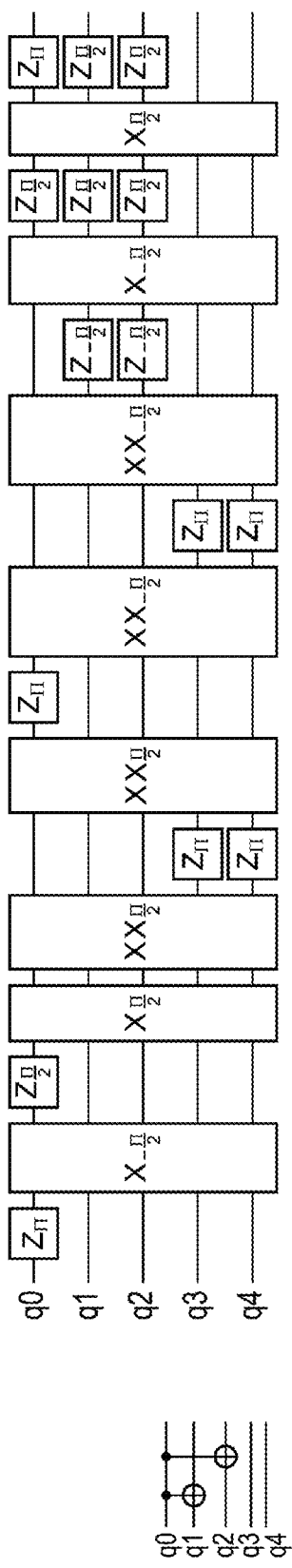
FIG. 5. shows an example recomposition of an entangling layer into a quantum circuit comprising only collective or entangling N-qubit quantum gates of a second predetermined category and one-qubit quantum gates of a third predetermined category

Reference is now made to FIG. 1, in which the main steps of a method for compiling a quantum circuit on a trapped-ion quantum processor are depicted.

In the step of obtaining S1, a quantum circuit is obtained. The quantum circuit is advantageously composed of two-qubit quantum gates of a first predetermined category of quantum gates, and/or one-qubit quantum gates.

More specifically, the quantum circuit is advantageously composed of CNOT quantum gates and any diagonal two-qubit quantum gates, forming the quantum gates of the first predetermined category, and/or one-qubit quantum gates.

A step of transformation S2 may potentially be applied to the quantum circuit. The step of transformation S2 is applied when the quantum circuit is composed of quantum gates other than those of the first predetermined category or one-qubit quantum gates. The step of transformation S2 comprises a transformation of the quantum circuit in order for that quantum circuit to no longer contain anything except quantum gates of the first predetermined category of quantum gates, and/or one-qubit quantum gates.

In the event that the quantum gate comprises only quantum gates of the first predetermined category of quantum gates, and/or one-qubit quantum gates, the step of separation S3 is implemented directly after the step of obtaining S1.

A step of separation S3 is then implemented. The step of separation S3 comprises the separation of the quantum circuit into local layers and entangling layers. The local layers comprise only one-qubit quantum gates.

The entangling layers comprise only two-qubit quantum gates of the first category and/or one-qubit quantum gates of a fourth category.

The one-qubit quantum gates of the fourth category are any one-qubit diagonal quantum gates.

The step of separation S3 comprises the generating of a directed acyclic graph associated with the quantum circuit.

FIG. 2a shows one example quantum circuit with three qubits q0, q1 and q2, comprising fourteen quantum operations, i.e. fourteen quantum gates. FIG. 2b shows the directed acyclic graph corresponding to the quantum circuit of FIG. 2a, the directed acyclic graph making it possible to represent the dependencies between the quantum operations. Thus, in that graph, the peaks represent quantum gates 1 to 14, and the crests represent the dependencies between the quantum gates.

FIGS. 2a and 2b are purely illustrative, as a quantum circuit that comprises a far larger number of qubits, such as greater than 10 qubits, preferably greater than 20 qubits, and preferably greater than 30 qubits, can be used. A quantum circuit comprising a much larger number of quantum gates can also be used.

Based on the directed acyclic graph, the separation of the quantum circuit into local layers and entangling layers is performed. More specifically, the separation is done by successively constructing the largest local layer based on the last entangling layer. This is repeated until all the quantum gates are included in one local or entangling layer.

The separation may be done sequentially, i.e. starting with gate 1 and continuing to gate 14.

FIG. 3a shows a pseudo-code implemented for the separation of the circuit into local layers. In that pseudo-code, the function get_succ returns the first gate succeeding the quantum gate g on the qubit q. In other words, the quantum gates succeeding the quantum gate g on the qubit q are grouped into a local layer, while those quantum gates are local quantum gates, meaning one-qubit quantum gates.

FIG. 3b shows a pseudo-code implemented for the separation of the circuit into entangling layers. In that pseudo-code, the function get_pred returns the first gate preceding the gate g on the qubit q and the function successors_ent returns the list of entangling quantum gates succeeding g, for all qubits.

In other words, the entangling layers may comprise one-qubit quantum gates, such as diagonal one-qubit quantum gates, in addition to entangling two-qubit quantum gates, which cannot be included in the local layers.

Steps S4 and S5 illustrate the compiling of the entangling layers. Steps S4 and S5 are intended to obtain a quantum circuit that comprises only quantum gates of a second category and of a third category of quantum gates. The quantum gates of the second category and of the third category of quantum gates correspond to quantum gates that can be executed on a trapped-ion quantum processor.

In particular, the quantum gates of the second category comprise Molmer-Sorensen N-qubit entangling gates and collective gates rotating along the X-axis. The quantum gates of the third category comprise local phase shifts along the Z-axis (or rotating along the Z-axis).

The step of breaking down the entangling layers S4 comprises the breaking down of the entangling layers into phase polynomials.

More specifically, at this stage of the method, the entangling layers comprise only two-qubit quantum gates of the first category and/or one-qubit quantum gates of the fourth category, meaning CNOT quantum gates and/or diagonal one-qubit quantum gates.

Any circuit containing such quantum gates may be written as follows:

$$U|x_1 \ldots x_n\rangle = e^{ip(x_1 \ldots x_n)}|h(x_1 \ldots x_n)\rangle,$$

Where h is linear and p is of the form:

$$P(x_1 \ldots x_n) = \Sigma \theta_i f_i(x_1 \ldots x_n),$$

And where the fi are linear functions.

In order to determine h, a matrix H comprising 0s and 1s, of dimensions N×N is constructed, where N is the number of qubits in the entangling layer. The matrix H is initialized to the identity, meaning as a matrix comprising a diagonal of 1.

In order to determine the linear functions fi, a hash table F is constructed. The hash table F hashes the elements of the matrix H to floats.

A plurality of execution models is then defined. In particular, when reading the quantum gates of the entangling layer, when:

the quantum gate is a CNOT quantum gate from the qubit i to the qubit j, then H[j]=H[j] XOR H[i], where XOR corresponds to XOT bit by bit by two sequences of bits, The quantum gate is a rotation along Z by angle a on qubit i, then:
if F[H[i]] is empty, then F[H[i]]=a,
otherwise, F[H[i]]=F[H[i]]+a,
the quantum gate is a controlled phase of angle a from qubit i to qubit j, then:

$$F[H[i] \text{ XOR } H[j]]+=-a/2,$$

$$F[H[i]]+=a/2,$$

$$F[H[j]]+=a/2.$$

Once these execution models have been implemented, the matrix H is broken down into a series of operations corresponding to a sequence of quantum gates using Gaussian elimination.

FIG. 4 shows the pseudo-code implemented for the Gaussian elimination applied to matrix H.

Gaussian elimination makes it possible to obtain a sequence 0 of operations that break down the matrix H. Each operation in that sequence 0 is a set of CNOT gates that share the same control qubit. Those gates are commonly called CNOT fan-out gates. Gaussian elimination is applied to each row 0 to N of the matrix H, respectively to each iteration J=0 to J=N−1. By iteratively applying Gaussian elimination to each row of the matrix H, a CNOT fan-out sequence with a linear size equal to N is obtained.

Next, a step of recomposing the entangling layers S5 is performed. This step of recomposing the entangling layers S5 comprises the recomposition of entangling layers so that they comprise only Molmer-Sorensen entangling quantum gates, collective quantum gates rotating along the X-axis, and quantum gates with local phase shifts along the Z-axis.

This recomposition is performed directly. More specifically, this means that the quantum circuit comprising only Molmer-Sorensen entangling quantum gates, collective quantum gates rotating along the X-axis, and quantum gates with local phase shifts along the Z-axis is obtained directly after the step of breakdown S4, without going through another form of quantum gate (particularly CNOT quantum gates).

Once the CNOT fan-out sequence has been obtained in the step of decomposition S4, a linear number of tables H0, H1, . . . , HN, corresponding to the matrix H at each iteration j=0 to j=N of the Gaussian elimination is obtained.

A plurality of execution models is determined for the step of recomposition. In particular:

if a row Hk[j] appears in the matrix F, a Z-rotating quantum gate with angle F[Hk[j]] is added to the qubit j after CNOT fan-out number k, If an entry F[b] does not appear anywhere in the sequence of Hi, where Hi belongs to the tables H0, H1, . . . , HN:

and if there is a table Hk and two qubits c and t such that Hk[c] XOR Hk[t]==b, where b is a chosen table,
then phase F[b] is inserted via a heuristic described below, if there is no such table Hk, the phase is inserted at the end of the sequence O of operations such that:

a set of CNOT quantum gates sharing the same target qubit (commonly called a CNOT fan-in) is inserted, whose control qubits are all those for which a bit equal to 1 is present in b except for a qubit y, that qubit y being the target qubit, a Z-rotating quantum gate with angle F[b] is inserted on qubit y, insertion of the same CNOT fan-in.

The remaining phases are inserted based on a heuristic using PHASES fan-out quantum gates. A PHASE fan-out is a set of controlled-phase quantum gates of the form:

$$\cos(\text{angle}/2)I - i\sin(\text{angle}/2)ZZ.$$

The PHASES fan-outs share the same control qubit. Those PHASES fan-outs are inserted such that:

for each phase F[b] there exists k, c, t as above;

if c is already being used as a control qubit during insertion of a phase in Hk via a PHASE fan-out, then a phase from c to t with an angle F[b] is inserted into the corresponding PHASE fan-out, otherwise, a new PHASE fan-out with a single phase from c to t where the angle is F[b] is inserted.

The same is done with t, if t is already in use.

Figure 6:
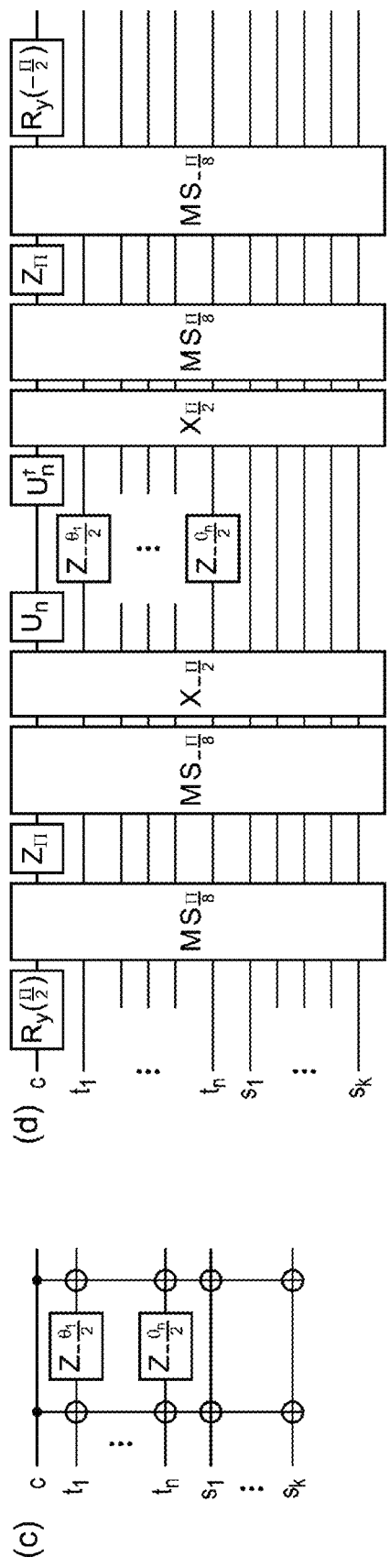
FIG. 6 shows another example recomposition of an entangling layer into a quantum circuit comprising only collective or entangling N-qubit quantum gates of a second predetermined category and one-qubit quantum gates of a third predetermined category.

FIG. 6 is an example recomposition of a CNOT fan-out quantum gate with two target qubits, into a quantum circuit comprising only Molmer-Sorensen entangling quantum gates, collective quantum gates rotating along the X-axis, and local phase shifts along the Z-axis.

Figure 7:
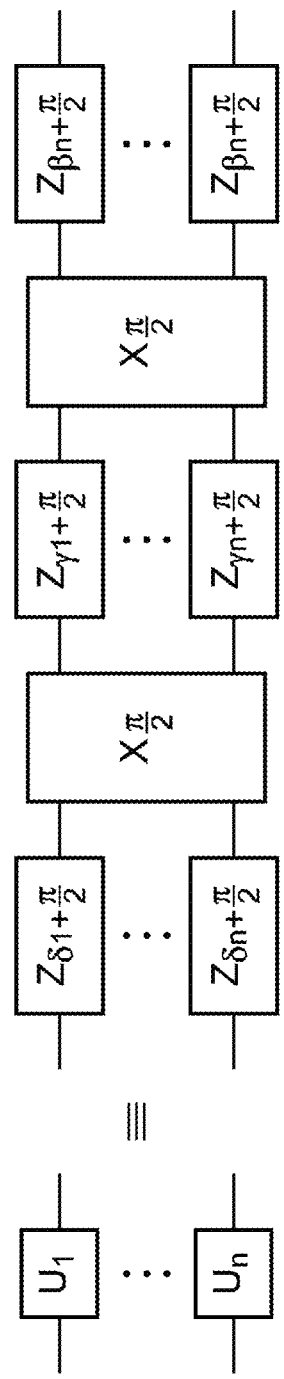
FIG. 7 shows an example quantum circuit derived from compiling a local layer.

FIG. 7 illustrates a recomposition of a PHASES fan-out into a quantum circuit comprising only Molmer-Sorensen entangling quantum gates, collective quantum gates rotating along the X-axis, and local phase shifts along the Z-axis.

During the recomposition of the circuits, the number of Molmer-Sorensen entangling gates and collective quantum gates rotating along the X-axis is minimized as a priority, as those gates are the most costly in terms of execution time and accuracy of the quantum circuit.

The number of Molmer-Sorensen entangling gates and collective quantum gates rotating along the X-axis may be constant.

Steps S6 to S9 then illustrate the compiling of local layers. The compiling of the local layers is meant to obtain a quantum circuit comprising only quantum gates rotating along the Z-axis and rotating along the X-axis. Advantageously, the quantum gates rotating along the X-axis are collective, meaning that a quantum gate rotating along the X-axis can be shared among multiple qubits of the quantum circuit, and even more advantageously among all qubits.

The compiling of the local layers comprises a step of breaking down the local layers S6. The step of breaking down the local layers S6 comprises a calculation of the local matrices U to be applied to each qubit. Those local matrices U are broken down into quantum gates rotating along the X-axis, along the Z-axis and along the X-axis. The ZXZ breakdown makes it possible to obtain three angles a, b and c such that:

U=Rz(a)Rx(b)Rz(c), where Rz and Rx correspond to the one-qubit rotations around the Z and X axes.

A first step of sub-breakdown S7 is then implemented. The first step of sub-breakdown S7 comprises the sub-breakdown of the quantum gates rotating along the X-axis into Hadamard P quantum gates, with a Hadamard rotation along the Z-axis. P Next, a second step of sub-breakdown S8 is implemented. The second step of sub-breakdown S8 uses the identity Rx(b)=P Rz(b), where P is a Hadamard gate, and P=Rz(pi/2) Rx(pi/2) Rz(pi/2). Each local matrix may thereby be formulated as follows:

$$U=Rz(a+pi/2)Rx(pi/2)Rz(b+pi)Rx(pi/2)Rz(c+pi/2)$$

Finally, a step of sharing S9 is implemented. The step of sharing collectivizes the quantum gates rotating along the X-axis to all qubits. This is because the Rx in the formula do not depend on the local matrix U because they are of the fixed angle pi/2. Thus, based on each local matrix U1 . . . UN, a quantum circuit comprising gates rotating along the Z axis and collective gates rotating along the X axis may be obtained, as depicted in FIG. 8.

The method for compiling according to the invention comprises a step of grouping S10, during which the compiled local and entangling layers are concatenated to obtain the quantum circuit that can be compiled on the trapped-ion quantum processor.

That quantum circuit therefore comprises only gates that can be executed by the trapped-ion quantum processor. More specifically, that quantum circuit comprises collective quantum gates rotating along the X-axis, Molmer-Sorensen entangling quantum gates, and quantum gates with local phase shifts along the Z-axis.

An additional step of reducing the size of the quantum circuit may also be performed. In particular, at most two quantum gates collectively rotating along the X-axis may follow each other without redundancies. It is thereby possible to merge quantum circuits containing more than two collective rotations along the X-axis and then break them down again using a method chosen beforehand, thereby producing a more concise compilable quantum circuit.

As an example, a comparison table showing the results of the various methods of the prior art compared with the results of the method according to the invention is described below.

TABLE 1

| Circuit | Method (1) | Method (2) | Method (3) | Method (4) |
|---|---|---|---|---|
| QFA-5 | 30 | 23 | 52 | 36 |
| QFA-10 | 135 | 53 | 112 | 76 |
| QFA-15 | 315 | 83 | 172 | 116 |
| QFA-20 | 570 | 113 | 232 | 156 |
| QFA-n | $3^{\wedge}(n(n-1)/2)$ | $6n-7$ | $12n-8$ | $8n-4$ |
| QFT-5 | 10 | 7 | 16 | 16 |
| QFT-10 | 45 | 17 | 36 | 36 |
| QFT-15 | 105 | 27 | 56 | 56 |
| QFT-20 | 190 | 37 | 76 | 76 |
| QFT-n | $n(n-1)/2$ | $2n-3$ | $4n-4$ | $4n-4$ |

The first column, "method (1)", shows the results of the first prior art described. The second column, "method (2)", shows the results of the first prior art described, wherein the compilation is done manually, by making reductive assumptions such as the semi-locality of the Molmer-Sorensen gates or the reduction of the force of interaction between the qubits during the application of a Molmer-Sorensen gate. The third column, "method (3)", corresponds to the same implementation, without the reductive assumptions described above. The fourth column, "method (4)", corresponds to the method according to the invention.

The result means the number of quantum gates comprised within the quantum circuit compiled by the corresponding method.

The first row corresponds to an implementation of a quantum Fourier transform on a quantum circuit with 5, 10, 15, 20 qubits. The next row corresponds to that same implementation for a quantum circuit with n qubits.

The third row corresponds to an implementation of a quantum Fourier adder on a quantum circuit with 5, 10, 15, 20 qubits. The next row corresponds to that same implementation for a quantum circuit with n qubits.

It therefore appears that the quantum circuits compiled by the first method comprise an exponential number of quantum gates, thereby increasing the execution time and reducing the accuracy of the circuit.

Additionally, the results from columns 2 and 3 cannot be verified by experimentation, given that the method is manual.

Thus, the method according to the invention makes it possible to generate more concise quantum circuits than those generated by the prior art, while offering a fully automated method.

LIST OF DOCUMENTS CITED

Non-Patent Literature

For all useful purposes, the following non-patent element(s) has/have been cited:
nplcit1: *Compiling quantum algorithms for architectures with multi-qubit gates*, Martinez et al;
nplcit2: *Basic circuit compilation techniques for an ion-trap quantum machine, Maslov and Use of global interactions in efficient quantum circuit constructions*, Maslov and Nam.

The invention claimed is:
1. A method of compiling a quantum circuit on a trapped-ion quantum processor, comprising:
  potentially a prior step of transforming the quantum circuit so that it no longer contains anything except:
    a first predetermined category of two-qubit quantum gates, and/or one-qubit quantum gates,
  a step of compiling the quantum gates,
  so that they only contain:
    a second predetermined category of collective or entangling N-qubit quantum gates, and
    a third predetermined category of one-qubit quantum gates,
  wherein all or at least some of those collective or entangling quantum gates simultaneously apply to at least three qubits, advantageously simultaneously apply to the majority of qubits, and even more advantageously simultaneously apply to all the qubits, and
  a step of grouping together the compiled quantum gates in a compiled quantum circuit.
2. The method of compiling a quantum circuit on a trapped-ion quantum processor according to claim 1, further comprising, between the possible prior step of transformation and the step of compiling the quantum gates:
  a step of separating said quantum circuit into:
  local layers comprising only one-qubit quantum gates,
  entangling layers comprising only:
    two-qubit quantum gates of the first predetermined category,
  and/or a fourth predetermined category of one-qubit quantum gates,
    said step of compiling the quantum gates further comprising:
  a step of compiling the local layers,
  a step of compiling the entangling layers, separate from the step of compiling the local layers, the step of compiling the entangling layers transforming the quantum gates of those entangling layers so that they contain only:
collective or entangling N-qubit quantum gates of the second predetermined category,
one-qubit quantum gates of the third predetermined category,
said step of grouping together the compiled quantum gates into a compiled quantum circuit is a grouping step that comprises grouping together the compiled local layers and the compiled entangling layers in a compiled quantum circuit.

3. The method of compiling a quantum circuit on a trapped-ion quantum processor according to claim 2, wherein the step of compiling the entangling layers comprises:
a breakdown of each entangling layer into a phase polynomial,
a direct recomposition in the form of collective or entangling N-qubit quantum gates of the second predetermined category and of one-qubit quantum gates if the third category without going through a form of two-qubit quantum gates of the first predetermined category.

4. The method of compiling a quantum circuit on a trapped-ion quantum processor according to claim 3, wherein the step of compiling the local layers comprises:
a breakdown of each local matrix of a local layer into a sequence of quantum gates with a rotation along the Z-axis, a rotation along the X-axis, and a rotation along the Z-axis,
a sub-breakdown of the rotation along the X-axis into a sequence of Hadamard quantum gates, with a Hadamard rotation along the Z-axis,
a sub-sub-breakdown of the Hadamard gate into a sequence of quantum gates with a rotation along the Z-axis, a rotation along the X-axis, and a rotation along the Z-axis, all three rotations having an angle of pi or pi/2,
a sharing between qubits, of rotation gates along the X-axis with an angle of pi/2.

5. The method of compiling a quantum circuit on a trapped-ion quantum processor according to claim 3, further comprising:
a prior step of transforming the quantum circuit so that it no longer contains anything except:
the first predetermined category of two-qubit quantum gates,
and/or one-qubit quantum gates.

6. The method of compiling a quantum circuit on a trapped-ion quantum processor according claim 3, wherein, during the step of compiling the entangling layers:
a number of collective or entangling quantum gates of the second category of quantum gates in the compiled entangling layers is minimized as a priority relative to a minimization of the quantum gates of the third category.

7. The method of compiling a quantum circuit on a trapped-ion quantum processor according to claim 3, wherein:
the first predetermined category of two-qubit quantum gates comprises:
diagonal two-qubit quantum gates,
CNOT quantum gates,
the second predetermined category of two-qubit quantum gates comprises:
Molmer-Sorensen N-qubit entangling gates,
collective gates rotating along the X-axis,
the third predetermined category of one-qubit quantum gates comprises:
gates offset locally along the Z-axis.

8. The method of compiling a quantum circuit on a trapped-ion quantum processor according to claim 2, wherein the step of compiling the local layers comprises:
a breakdown of each local matrix of a local layer into a sequence of quantum gates with a rotation along the Z-axis, a rotation along the X-axis, and a rotation along the Z-axis,
a sub-breakdown of the rotation along the X-axis into a sequence of Hadamard quantum gates, with a Hadamard rotation along the Z-axis,
a sub-sub-breakdown of the Hadamard gate into a sequence of quantum gates with a rotation along the Z-axis, a rotation along the X-axis, and a rotation along the Z-axis, all three rotations having an angle of pi or pi/2,
a sharing between qubits, of rotation gates along the X-axis with an angle of pi/2.

9. The method of compiling a quantum circuit on a trapped-ion quantum processor according to claim 8, further comprising:
a prior step of transforming the quantum circuit so that it no longer contains anything except:
the first predetermined category of two-qubit quantum gates,
and/or one-qubit quantum gates.

10. The method of compiling a quantum circuit on a trapped-ion quantum processor according claim 8, wherein, during the step of compiling the entangling layers:
a number of collective or entangling quantum gates of the second category of quantum gates in the compiled entangling layers is minimized as a priority relative to a minimization of the quantum gates of the third category.

11. The method of compiling a quantum circuit on a trapped-ion quantum processor according to claim 8, wherein:
the first predetermined category of two-qubit quantum gates comprises:
diagonal two-qubit quantum gates,
CNOT quantum gates,
the second predetermined category of two-qubit quantum gates comprises:
Molmer-Sorensen N-qubit entangling gates,
collective gates rotating along the X-axis,
the third predetermined category of one-qubit quantum gates comprises:
gates offset locally along the Z-axis.

12. The method of compiling a quantum circuit on a trapped-ion quantum processor according to claim 2, wherein:
the fourth predetermined category of one-qubit quantum gates comprises:
diagonal one-qubit gates.

13. The method of compiling a quantum circuit on a trapped-ion quantum processor according to claim 2, further comprising:
a prior step of transforming the quantum circuit so that it no longer contains anything except:
the first predetermined category of two-qubit quantum gates,
and/or one-qubit quantum gates.

14. The method of compiling a quantum circuit on a trapped-ion quantum processor according claim 2, wherein, during the step of compiling the entangling layers:
   a number of collective or entangling quantum gates of the second category of quantum gates in the compiled entangling layers is minimized as a priority relative to a minimization of the quantum gates of the third category.

15. The method of compiling a quantum circuit on a trapped-ion quantum processor according to claim 2, wherein:
   the first predetermined category of two-qubit quantum gates comprises:
   diagonal two-qubit quantum gates,
   CNOT quantum gates,
   the second predetermined category of two-qubit quantum gates comprises:
   Molmer-Sorensen N-qubit entangling gates,
   collective gates rotating along the X-axis,
   the third predetermined category of one-qubit quantum gates comprises:
   gates offset locally along the Z-axis.

16. The method of compiling a quantum circuit on a trapped-ion quantum processor according to claim 1, further comprising:
   a prior step of transforming the quantum circuit so that it no longer contains anything except:
   the first predetermined category of two-qubit quantum gates,
   and/or one-qubit quantum gates.

17. The method of compiling a quantum circuit on a trapped-ion quantum processor according claim 16, wherein, during the step of compiling the entangling layers:
   a number of collective or entangling quantum gates of the second category of quantum gates in the compiled entangling layers is minimized as a priority relative to a minimization of the quantum gates of the third category.

18. The method of compiling a quantum circuit on a trapped-ion quantum processor according claim 1, wherein, during the step of compiling the entangling layers:
   a number of collective or entangling quantum gates of the second category of quantum gates in the compiled entangling layers is minimized as a priority relative to a minimization of the quantum gates of the third category.

19. The method of compiling a quantum circuit on a trapped-ion quantum processor according to claim 1, wherein:
   the first predetermined category of two-qubit quantum gates comprises:
   diagonal two-qubit quantum gates,
   CNOT quantum gates,
      the second predetermined category of two-qubit quantum gates comprises:
   Molmer-Sorensen N-qubit entangling gates,
   collective gates rotating along the X-axis,
      the third predetermined category of one-qubit quantum gates comprises:
   gates offset locally along the Z-axis.

* * * * *